United States Patent [19]

Andros et al.

[11] Patent Number: 5,077,834
[45] Date of Patent: Dec. 31, 1991

[54] PAGING RECEIVER WITH CONTINUOUSLY TUNABLE ANTENNA AND RF AMPLIFIER

[75] Inventors: Andrew A. Andros, Spring, Tex.; Thomas J. Campana, Jr., Chicago, Ill.

[73] Assignee: Telefind Corporation, Coral Gables, Fla.

[21] Appl. No.: 381,483

[22] Filed: Jul. 18, 1989

Related U.S. Application Data

[63] Continuation-in-part of Ser. No. 329,543, Mar. 28, 1989, Pat. No. 5,012,235, which is a continuation-in-part of Ser. No. 110,514, Oct. 20, 1987, Pat. No. 4,851,830.

[51] Int. Cl.⁵ .............................................. H04B 1/18
[52] U.S. Cl. .................................... 455/193; 455/184; 455/234; 455/266
[58] Field of Search ............... 455/193, 195, 200, 266, 455/289, 38, 228, 341, 184, 234, 226; 340/825.44

[56] References Cited

U.S. PATENT DOCUMENTS

| | | | |
|---|---|---|---|
| 4,249,261 | 2/1981 | Ogita | 455/266 |
| 4,291,414 | 9/1981 | Kimura | 455/184 |
| 4,704,734 | 11/1987 | Menich et al. | 455/134 |
| 4,851,830 | 7/1989 | Andros et al. | 455/71 |
| 4,862,516 | 8/1989 | MacNak et al. | 455/195 |

Primary Examiner—Reinhard J. Eisenzopf
Assistant Examiner—Edward Urban
Attorney, Agent, or Firm—Antonelli, Terry, Stout & Kraus

[57] ABSTRACT

A RF paging receiver which is tunable to channels to receive pages comprising characters to be displayed with the pages being transmitted in a plurality of licensed frequency bands with each band containing a plurality of FM channels in which signal strength of pages on received channels in the bands varies as a result of variable antenna gain with programming of channels being accomplished by channel programming commands in accordance with the invention includes a tunable antenna (12, 14) having a reception bandwidth spanning the frequency bands with the antenna being tunable in response to an antenna tuning signal to achieve maximum antenna gain for a received channel in any one of the plurality of licensed frequency bands; a RF tuner (16), coupled to the tunable antenna, for receiving individual channels from the bands in response to varying a receiver tuning signal specifying reception of one of the channels within the plurality of frequency bands, the RF tuner comprising a plurality of RF amplifiers (102, 104 and 106) with each RF amplifier for amplifying channels from at least one different licensed frequency band, each RF amplifier having an operating bandwidth which is narrower in frequency than the frequency band of channels applied to the RF amplifier and which is shiftable to center the operating bandwidth within the frequency band of channels amplified by the RF amplifier on the specified channel; an IF signal processor (34), coupled to the RF tuner, for producing an intermediate frequency signal, for producing the antenna tuning signal which is a function of the level of the intermediate signal during operation of the RF tuner to dynamically tune the antenna to achieve maximum antenna gain in response to variation in the gain of the antenna in receiving a channel from any one of the channels within the frequency bands and for providing the RF amplifier tuning signal which is a function of the level of the intermediate frequency signal and the receiver tuning signal; a display (64') for displaying characters contained within a page; and a controller (24), coupled to the intermediate frequency signal, and responsive to channel programming commands, for decoding a change in at least one channel contained within a channel programming command and controlling generation of the receiver tuning signal applied to the RF tuner specifying reception of one channel specified by a received channel programming command from one of the frequency bands to cause reception of the specified channel and display of characters in pages received on the channel on the display.

38 Claims, 10 Drawing Sheets

PAGING RECEIVER WITH CONTINUOUSLY TUNABLE ANTENNA AND RF AMPLIFIER

CROSS REFERENCE TO RELATED APPLICATION

This application is a Continuation-in-Part of U.S. application Ser. No. 329,543, filed Mar. 28, 1989, now U.S. Pat. No. 5,012,235, entitled "Paging Receiver With Continuously Tunable Antenna and RF Amplifier" which is a Continuation-In-Part of U.S. application Ser. No. 110,514, filed on Oct. 20, 1987, entitled "Paging Receiver With Continuously Tunable Antenna" now U.S. Pat. No. 4,851,830. Reference is also made to U.S. application Ser. No. 381,527 filed on even date herewith, by Andrew A. Andros et al, entitled "Paging Receiver With Continuously Tunable Antenna". The subject matter of the aforementioned applications is incorporated herein by reference in its entirety.

DESCRIPTION

1. Technical Field

The present invention relates to RF paging receivers for receiving pages from channels within at least one licensed radio common carrier frequency band. More particularly, the present invention relates to paging receivers of the foregoing type having dynamically programmable channels of reception from at least one frequency band.

2. Background Art

U.S. patent application Ser. No. 110,514, now U.S. Pat. No. 4,851,830 discloses a paging receiver with a continuously tunable antenna having programmable channels for receiving pages from 10,600 channels contained in the VHF and UHF bands (149-162, 278-290 and 449-462 MHz) used for in approximately 98% of the licensed paging channels in use today in the world. The tuned antenna disclosed in the Ser. No. 110,514 is required to have a wide bandwidth to permit the reception of channels within the aforementioned plural frequency bands. The channels which are received by the paging receiver disclosed in the aforementioned application are dynamically programmable by a channel programming command which permits the channel(s) being received to be changed to accommodate varying paging traffic on channels used by a local paging service as well as to accommodate transporting of the paging receiver to remote areas out of broadcast range of the transmitter of the local paging service providing paging service to receive pages on another channel(s) which are relayed to the remote area by a long distance paging network. Existing long distance commercial paging networks to date rely upon paging receivers receiving a single channel or to sequentially scan a group of closely spaced channels in a single frequency band.

FIG. 1 illustrates a block diagram of paging receiver 10 as disclosed in Ser. No. 110,514. Actual circuits for implementing the various functions of the block diagram of FIG. 1 are set forth in FIGS. 7-20 of Ser. No. 110,514. Additionally, the main control program for the main CPU 24 is set forth in the Appendix contained within Ser. No. 110,514.

An internal antenna 12 functions to receive a total of 10,600 possible programmable channels from the three discrete frequency bands referred to above. The channels are programmed by a channel programming command disclosed in Ser. No. 110,514. Because of the large number of possible channels which may be received in the distinct three frequency bands, the antenna 12 has a broad band reception characteristic. In the paging receiver, the antenna 12 is designed to the extent possible to be resonant in all of the three frequency bands from which it is designed to receive channels. In other words, an optimum impedance match is desired.

The gain of the antenna 12 is subject to substantial variation as a consequence of interaction of the antenna with the person on which the paging receiver is typically located and as a consequence of interaction of the antenna with the physical surroundings of the paging receiver. The person's body on which a paging receiver is located, physical surroundings and electrical interference caused by the main CPU 24 and VCO 30 described below can substantially degrade the gain of the received page applied by the antenna 12 to antenna circuit 14. The antenna circuit 14 is a tuner containing variable capacitance diodes to which is applied an ANTENNA TUNING SIGNAL to maximize the gain of the antenna 12 for the particular channel that RF tuner 16 is tuned to receive. The antenna circuit 14 is tuned by the ANTENNA TUNING SIGNAL which functions to tune the antenna 12 to achieve maximum gain in a manner described below in detail. The RF tuner 16 is comprised of three separate radio frequency amplifiers and mixers 18, 20 and 22 which respectively receive UHF 149-162 and 278-190 MHz channels and 449-462 MHz VHF channels. The main CPU 24 controls the activation of a power controller 26 which selectively activates one of the amplifier and mixer circuits 18, 20 and 22 depending upon in which of the frequency bands a page is being received. The digital RECEIVER TUNING SIGNAL outputted by the main CPU 24 specifies one of the 10,600 possible channels to be received which are stored in ROM 58 as discussed below. The RECEIVER TUNING SIGNAL is applied to phase lock loop 28 which frequency locks the voltage controlled oscillator 30 on the particular channel specified by the RECEIVER TUNING SIGNAL. When a particular channel is to be received by the RF tuner 16, the main CPU 24 digitally commands the power controller 26 to activate a particular one of the amplifier and mixer circuits 18, 20 and 22 which is to receive the channel to be received. By deactivating the remaining two amplifier mixer circuits power is conserved over that which would be consumed if all three amplifiers and mixer circuits 18, 20 and 22 were simultaneously activated which is important in a battery operated paging receiver. The voltage controlled oscillator 30 produces an output frequency which is mixed with the signal being received by one of the amplifier and mixers 18, 20 and 22 to produce a 21.4 MHz output signal. The 21.4 MHz output signal is filtered by a 21.4 MHz filter 32. The output of the 21.4 MHz filter 32 is applied to an IF processing signal circuit 34 to produce the IF signal of 450 kHz. The output signal from the mixer oscillator 36 is applied to an IF amplifier 38 which amplifies the IF signal to a level sufficient for discrimination by FM discriminator circuit 40. A RSSI circuit (received signal strength indicator) 42 produces an output signal having a magnitude directly proportional to the level of the output signal from the discriminator 40. The RSSI signal outputted by the RSSI circuit 42 is applied to an antenna controller circuit 44. The antenna controller circuit 44 contains an analog-to-digital converter 46 which converts the analog RSSI signal into digital format suitable for processing by a dedicated ASIC microprocessor. The ASIC microprocessor executes a program contained in a ROM in the ASIC circuit. The ASIC microprocessor functions to produce a wobble signal which is outputted as a variable digital value which is applied to digital-to-analog converter 48 to produce the ANTENNA TUNING SIGNAL having a variable analog value which causes the antenna circuit 14 to be tuned variably through a frequency band for the purpose of continually locking on the point of maximum gain as a channel is being received. The variation in signal amplitude caused by the wobbling of the tuned frequency of the antenna circuit 14 is detected by the RSSI circuit 42 so that the antenna controller circuit 44 continually outputs an ANTENNA TUNING SIGNAL which tunes the antenna circuit to achieve maximum gain for the antenna 12. The ANTENNA TUNING SIGNAL compensates for environmental factors which change the gain of the antenna 12 during reception such as variable inductance and capacitance caused by a person's body and the physical surroundings as well as compensating for electrical interference caused by the CPU 24 and VCO 30. The discriminator circuit 40 outputs either no signal (level F) or one of fifteen discrete sinusoidal frequencies each of which encodes a different signal value received from either an analog or digital FM paging receiver transmitter. A buffer amplifier 50 amplifies the sinusoidal output signal from the discriminator circuit 40 to a level to create a square wave having a period equal to the period of the sinusoidal signal outputted by the discriminator 40. The square wave outputted by the buffer amplifier 50 is filtered by low pass filter 52 to attenuate frequencies below 400 hertz. The output of the low pass filter 52 is applied to high pass filter 54 which attenuates channels above 3000 hertz. A tone decoder circuit 56 converts the discrete tones contained within the 400 to 3000 hertz pass band defined by the low pass filter 52 and high pass filter 54 to produce an output level signal indicative of 16 possible levels. The main CPU 24 processes successive coded transmissions of data by combining them into a two-digit decimal number and decoding the two-digit number into alphanumeric characters. Single coded transmissions are used for numeric only characters. The control program for the main CPU 24, is stored in ROM 58. The ROM 58 also stores the possible channels which may be received, which in the preferred embodiment are 10,600, a command structure table used for decoding each of the commands as disclosed in Ser. No. 110,514, as well as the display control for the LCD display 64'. Variable data is stored in RAM 60. The RAM 60 has separate memory sections for storing pages including specific memory sections which are addressable by command, the channels which are programmed to be received by the channel programming command including any destination code for restricting reception of pages or a group of paging receivers to receive a page in a geographical area and the paging receiver identification. The main CPU 24 controls a liquid crystal display driver circuit 62,. The liquid crystal driver circuit 62' drives a liquid crystal display 64'. An external data port 67 is used to relay the output signal from the discriminator 52 to another data processing or storage device when the main CPU 24 executes an external data command. A port 68 is coupled to the main CPU 24 for driving an external printer. A port 69 is provided for establishing necessary communications between the CPU 24 and an external printer. A display switch 70 is used for activating the display 64'.

A light switch 71 is used for activating back lighting of the display 64'. The switches 70 and 71 may also be used for inputting data when suitable displays are made on the display 64' by the control program of the main CPU 24. Port 72 is connected to the paging receiver battery (not illustrated) for providing power. Port 73 is provided for activating an audio alarm contained in the paging receiver and port 74 permits connection to an external antenna which may be used when the paging receiver is connected to an external device such as a printer.

The main CPU 24 is responsive to a channel programming command to dynamically tune the RF tuner 16 to discrete channels. Each channel programming command is decoded by the main CPU 24 to output any change in channel contained therein of the 10,600 possible channels stored in ROM 58 for storage in a channel memory section of the random access memory 60.

The continuously tunable antenna of the paging receiver discussed above provides dynamic compensation for variable antenna gain consequent from receiving programmable channels within at least one frequency band. Dynamic compensation for variable antenna gain is especially important in achieving maximum reception range and accurate reception on programmable channels spanning at least one frequency band when the antenna is internal within the case of the paging receiver. As a consequence of an internal antenna having a short length, a person's body carrying the paging receiver and surroundings proximate to the person will often substantially vary the antenna gain. The dynamically tuned antenna of the paging receiver described above satisfactorily compensates for variation in antenna gain in a paging receiver having an internal antenna for receiving pages on channels which are dynamically programmed from multiple frequency bands.

The paging receiver discussed above is subject to degradation in reception performance in metropolitan areas. This degradation is caused by the RF amplifiers 18, 20 and 22 having a broadband reception characteristic spanning the entire bandwidth of each frequency band for amplifying pages received on channels contained within the band. For example, if the paging receiver is tuned to receive a channel on one end of a frequency band by applying an appropriate output signal from VCO 30 to the mixer within the amplifier, the broadband amplification characteristic of the amplifier will amplify received signals contained in other parts of the band which diminishes the overall signal to noise ratio of the signal being inputted into the mixer on the channel being received which contains the page. This diminishing of the signal to noise ratio can severely degrade the ability of the paging receiver to accurately receive alphanumeric and numeric pages in areas such as large metropolitan areas where large numbers of other signals are simultaneously present from non paging sources or from other paging channels within a frequency band containing a channel on which the paging receiver is receiving pages.

DISCLOSURE OF THE INVENTION

The present invention is an improved paging receiver which utilizes a tunable antenna and tuned RF amplifier to achieve maximum gain on channels being received from at least one of the plurality of licensed radio frequency bands which are received by paging receivers throughout the world today. The paging receiver preferably is tunable by a channel programming command to program reception of at least one channel which may be chosen from a plurality of frequency bands which are used for paging receivers. The tunable antenna is tuned to maximize antenna gain for each channel being received and works in the manner described above with reference to Ser. No. 110,514. In accordance with the invention, each RF amplifier for amplifying a page received on any channel from a frequency band has an operating bandwidth which is narrower in frequency than the frequency band and is tunable to shift the center of the operating bandwidth within the frequency band on the specified channel to maximize amplifier gain.

Tests have shown that the addition of the tunable RF amplifier for receiving channels from licensed radio common frequency bands used for paging receivers increases the gain of the signal outputted from the RF amplifier by up to 10 dB. The narrowing of the operating bandwidth of the RF amplifier by the present invention from an operating bandwidth spanning the entire frequency band as in the receiver of FIG. 1 to an operating bandwidth of approximately 675 kHz at the 65 dB down point increases the reliability of receiving pages in areas where many other signals exist in the frequency band on which the channel is being received. The combination of the tunable antenna and tunable RF amplifier(s) permits a paging receiver in accordance with the present invention to reliably receive pages out to line of site distances which is the practical limit of pages transmitted on FM radio common carriers within the bands licensed for paging throughout the world today if signal reflections are not present.

BEST MODE FOR CARRYING OUT THE INVENTION

Figure 1:
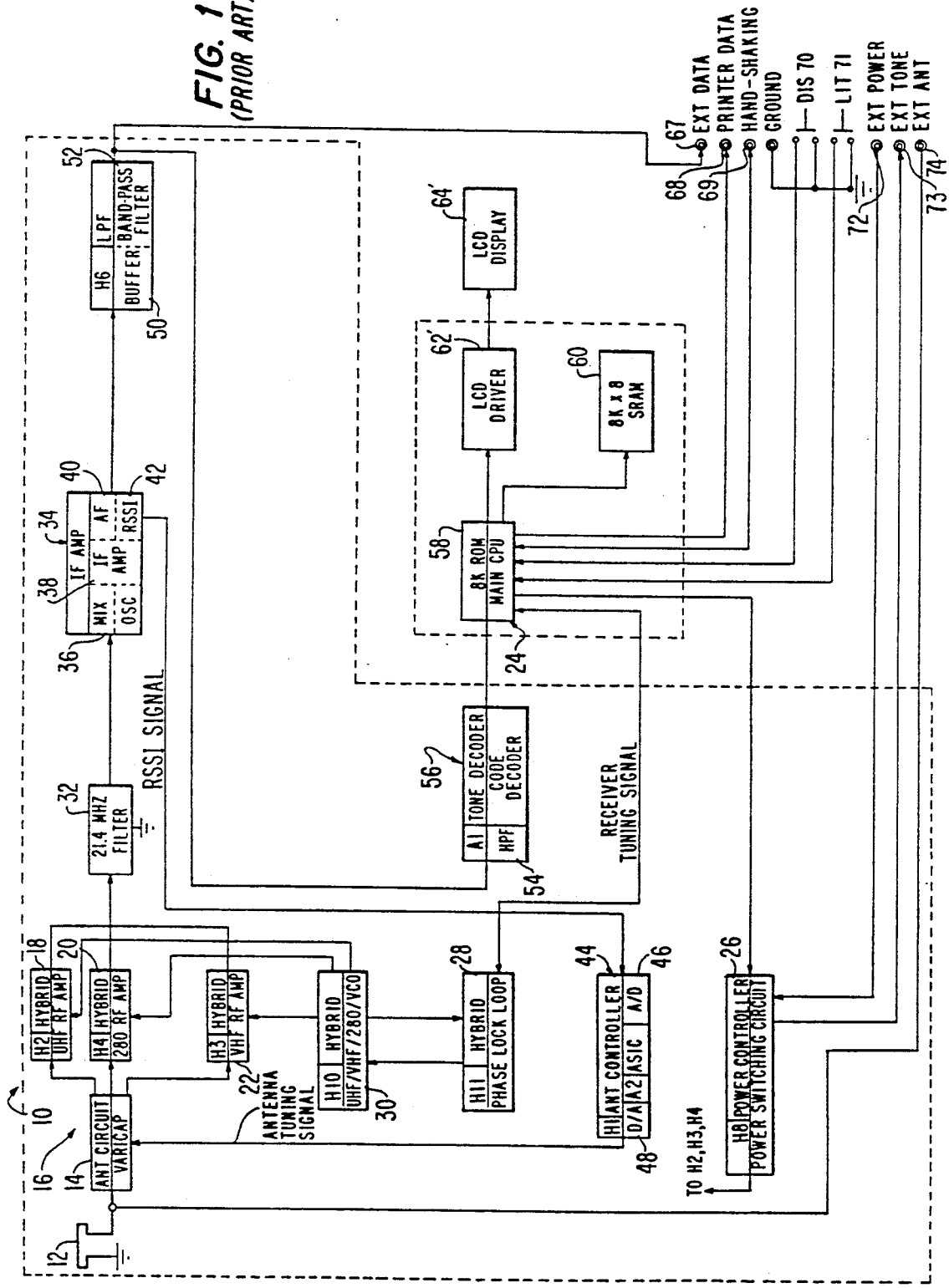
FIG. 1 illustrates a prior art paging receiver of the assignee of the present invention.
Figure 2:
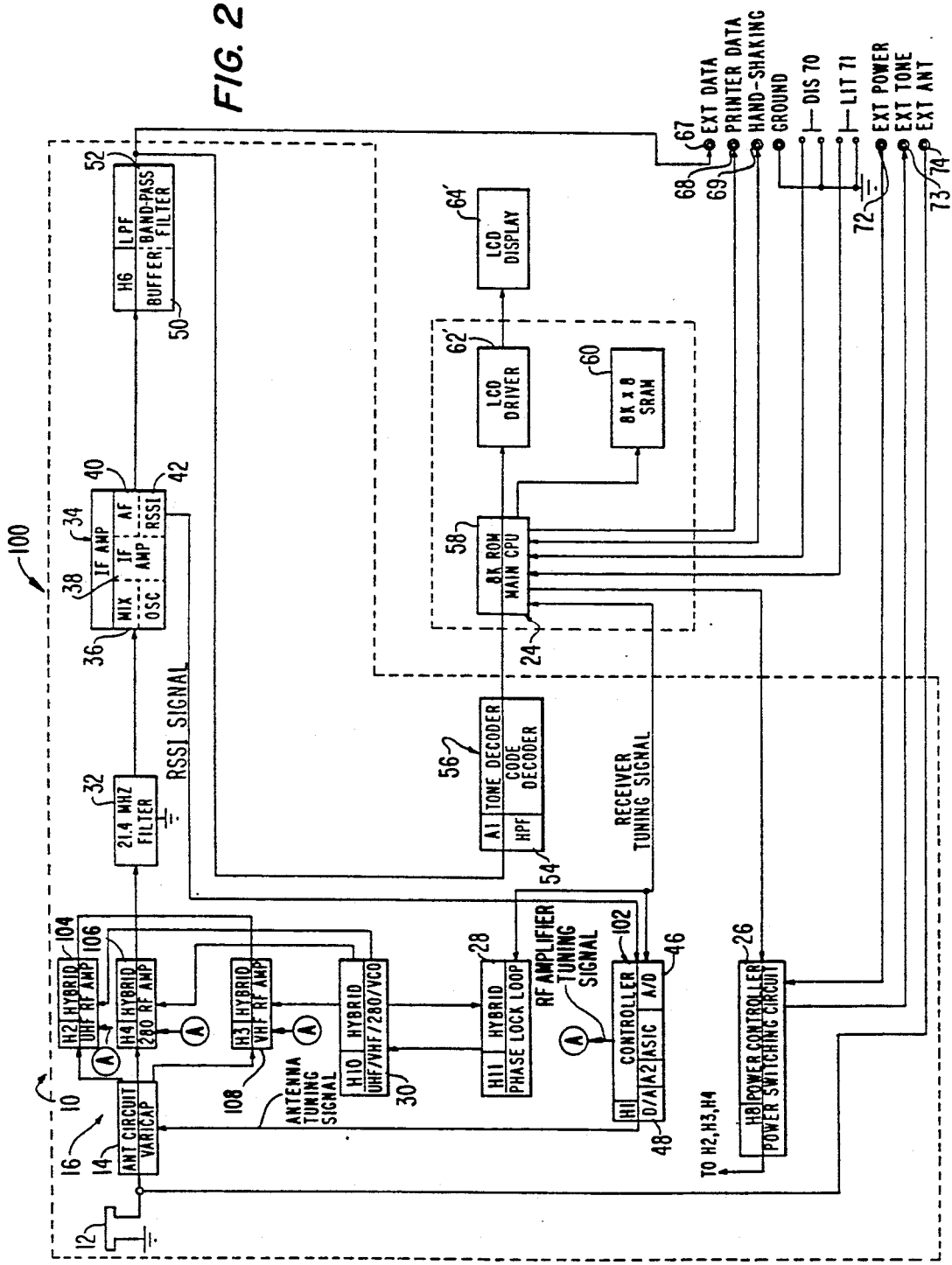
FIG. 2 illustrates a block diagram of a paging receiver in accordance with the present invention.

FIG. 2 illustrates a block diagram of a RF paging receiver 100 in accordance with the present invention. Like parts are identified by like reference numerals in FIGS. 1 and 2. Parts in FIG. 2 which are identical to those illustrated in FIG. 1 and which are not necessary for understanding the present invention are not discussed in conjunction with FIG. 2. The paging receiver 100 of FIG. 2 differs from the paging receiver of FIG. 1 in that the RF amplifier contained in each of the RF amplifier and mixers 104, 106 and 108 has a shiftable operating bandwidth which is centered by an RF AMPLIFIER TUNING SIGNAL on the channel being received. The RF AMPLIFIER TUNING SIGNAL is a function of the RECEIVER TUNING SIGNAL and the RSSI SIGNAL. The RF AMPLIFIER TUNING SIGNAL is produced by the controller 102. The controller 102 controls the antenna 12 in the same manner as described in conjunction with the prior art of FIG. 1 and further produces the RF AMPLIFIER TUNING SIGNAL as discussed below in conjunction with FIGS. 3 and 4. The RF AMPLIFIER TUNING SIGNAL shifts the center of the operating bandwidth of the RF amplifiers and mixers 104, 106 and 108 as a function of the gain of the antenna as indicated by the RSSI signal produced by the IF amplifier 34 as used in the prior art FIG. 1 to tune the antenna 12 and the channel being received as specified by the RECEIVER TUNING SIGNAL produced by the main CPU 24. As described below, the operating bandwidth of one of the RF amplifiers and mixers 104, 106 and 18, which is activated by the power controller 26 to receive the specified channel, is shifted to track the gain of the antenna and the RECEIVER TUNING SIGNAL so as to center the operating bandwidth of the RF amplifier to produce maximum gain of the amplified signals being applied to the mixer within the activated RF amplifier. The operating bandwidth of each of the RF amplifiers is tuned to a much narrower frequency range, which in a preferred embodiment is approximately 675 kilocycles in width at the 65 dB downpoint from the maximum amplitude at the center frequency of the operating bandwidth. Each amplifier 104, 106, and 108 is tunable to receive channels throughout the 13 megacycle bandwidth of each of the three licensed radio common carrier frequency bands on which pages are transmitted in the world today. As a consequence of the amplifiers within the RF amplifiers and mixers 104, 106 and 108 having a much higher Q than the 13 megacycle bandwidth of the licensed frequency bands from which channels are received, amplification of other signals which are within the frequency band being received but outside the operating bandwidth is eliminated which increases the signal-to-noise ratio of the output signal from the amplifier by up to 10 dB.

Figure 3:
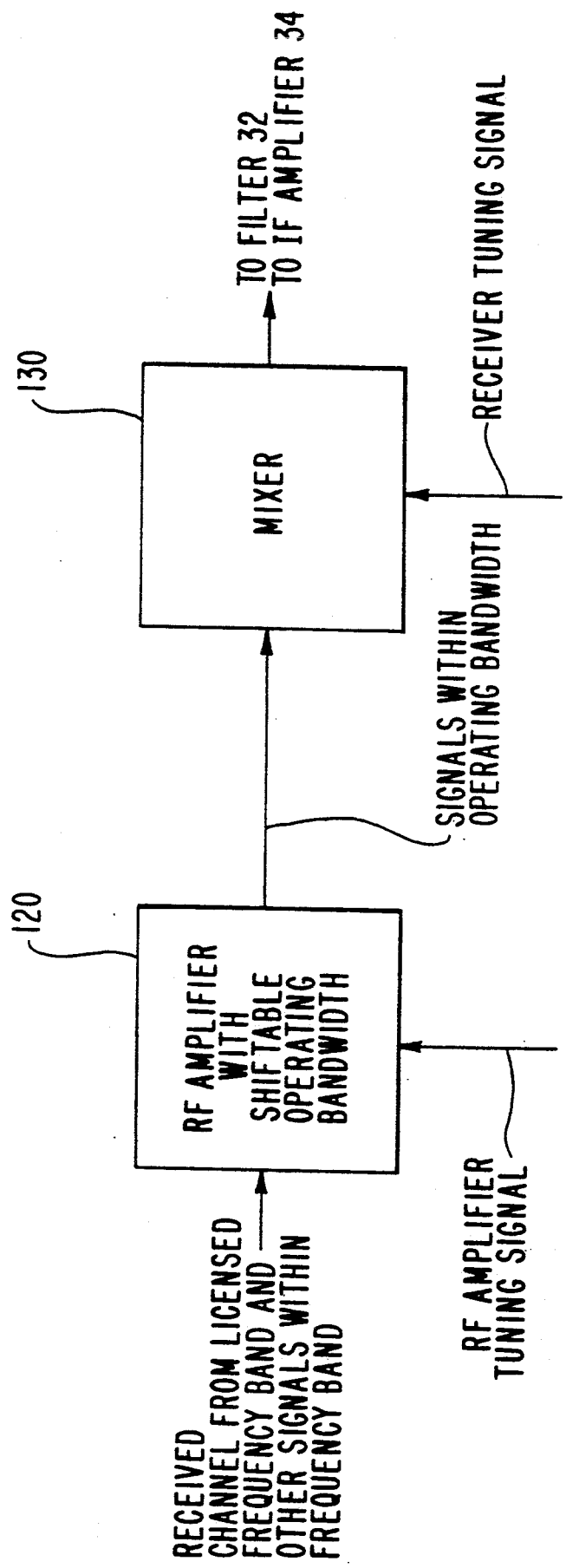
FIG. 3 is a block diagram of an RF amplifier in accordance with the invention.

FIG. 3 illustrates the block diagram of each of the RF amplifiers and mixers 104, 106 and 108 in accordance with the present invention. A received channel from a licensed frequency band including other signals within the frequency band is applied to RF amplifier 120 which has a shiftable operating bandwidth as discussed below in conjunction with FIG. 5. The operating bandwidth of the RF amplifier 120 is shifted within the 13 MhZ bandwidth of the frequency band being amplified by the amplifier to center the operating bandwidth under control of the RF AMPLIFIER TUNING SIGNAL as discussed below with respect to FIG. 4. The output of the RF amplifier 120 contains signals within the operating bandwidth. As a consequence of the operating bandwidth being approximately 675 KhZ at a 65 dB downpoint, the great majority of other signals within the frequency band containing the received channel are rejected by the RF amplifier which increases the signal-to-noise ratio substantially up to approximately 10 dB over that which was achieved by the prior art paging receiver of FIG. 1 in areas, such as large metropolitan areas, where many signals are present within the frequency band within which the received channel is contained but outside the operating bandwidth. Mixer 130 functions in the conventional manner to shift the frequency of the output signal from the RF amplifier 120 to the intermediate frequency as a consequence of the RECEIVER TUNING SIGNAL being applied thereto by the VCO 30. The output of the mixer is applied to the filter 32 and IF amplifier 34 as in the paging receiver of FIG. 1.

Figure 4:
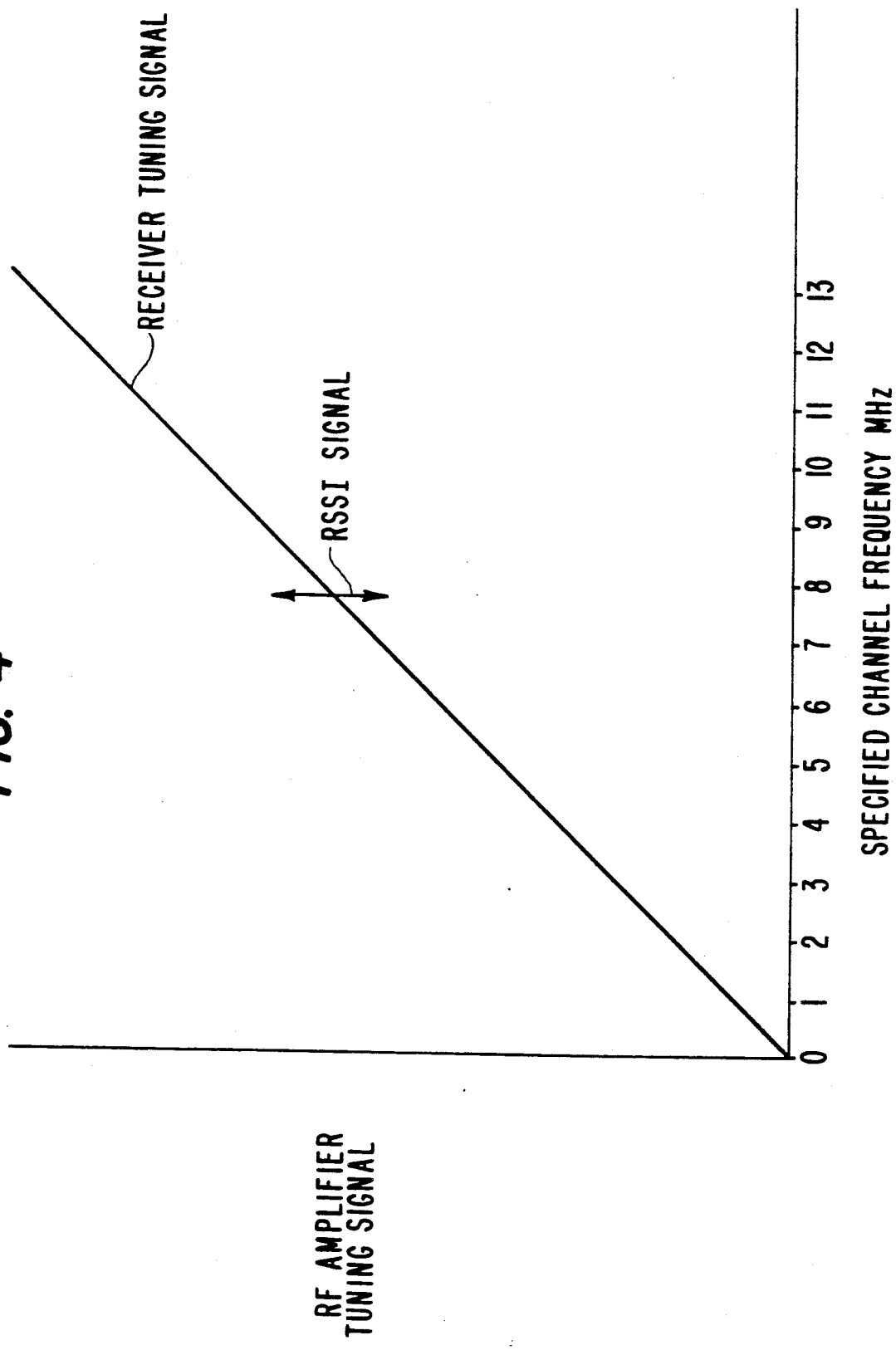
FIG. 4 illustrates the graphical relationship between the RF AMPLIFIER TUNING SIGNAL, RECEIVER TUNING SIGNAL, RSSI SIGNAL and specified channel frequency.

FIG. 4 graphically illustrates the relationship of the RF AMPLIFIER TUNING SIGNAL as a function of the RECEIVER TUNING SIGNAL and RSSI SIGNAL. In the preferred embodiment of the present invention, the RF AMPLIFIER TUNING SIGNAL is proportional to the sum of the RECEIVER TUNING SIGNAL and the RSSI SIGNAL. The RECEIVER TUNING SIGNAL is a linear function of the specified channel being received within a licensed frequency band with the RECEIVER TUNING SIGNAL being at a minimum (e.g. 3.5 volts) at the lowest channel within the frequency band and being at a maximum voltage at the highest channel within the frequency band and varying directly proportionally to the frequency of the channel being received in the licensed frequency band between the lowest and highest channels of the licensed frequency band. For example, reception of a channel midway between the lowest and highest channels would result in the generation of a RECEIVER TUNING SIGNAL having ½ the maximum level of the RECEIVER TUNING SIGNAL. The RSSI signal is directly proportional to the level of the output signal produced by the IF amplifier 34 and is also used in the generation of the antenna tuning signal applied to the antenna circuit 14 as in the paging receiver of FIG. 1. The RSSI signal varies linearly as a function of the antenna gain. The controller 102 produces the RF AMPLIFIER TUNING SIGNAL which is proportional to the sum of the RECEIVER TUNING SIGNAL and the RSSI SIGNAL with the magnitude of the RF AMPLIFIER TUNING SIGNAL varying with the variation of the RSSI SIGNAL and antenna gain with the RECEIVER TUNING SIGNAL component of the RF AMPLIFIER TUNING SIGNAL being constant for each channel being received. As a consequence of the RF AMPLIFIER TUNING SIGNAL being proportional to the fixed RECEIVER TUNING SIGNAL and the RSSI SIGNAL which is directly proportional to the variation in gain of the antenna, the RF AMPLIFIER TUNING SIGNAL provides a voltage for shifting the operating bandwidth of the RF amplifier to center the operating bandwidth on the specified channel being received to achieve maximum gain to provide a maximum signal to noise ratio which substantially enhances the ability of the paging receiver in accordance with the invention to accurately receive pages including discriminating characters within alphanumeric pages at long distances from the transmitter and in areas with many signals present in a frequency band in which a page is being received.

Figure 5:
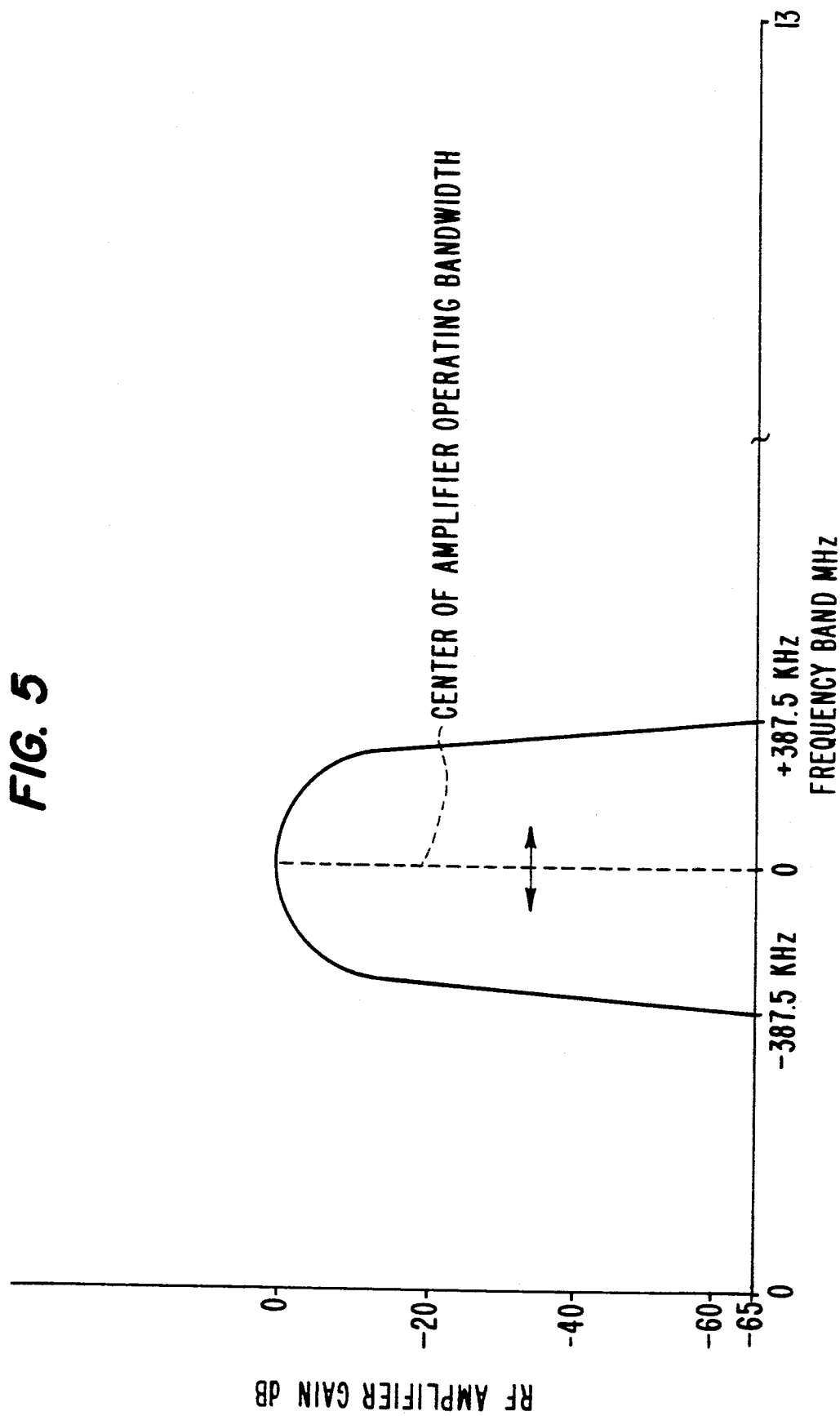
FIG. 5 illustrates the gain characteristic of each RF amplifier of the paging receiver of the present invention within a frequency band.
Figure 6:
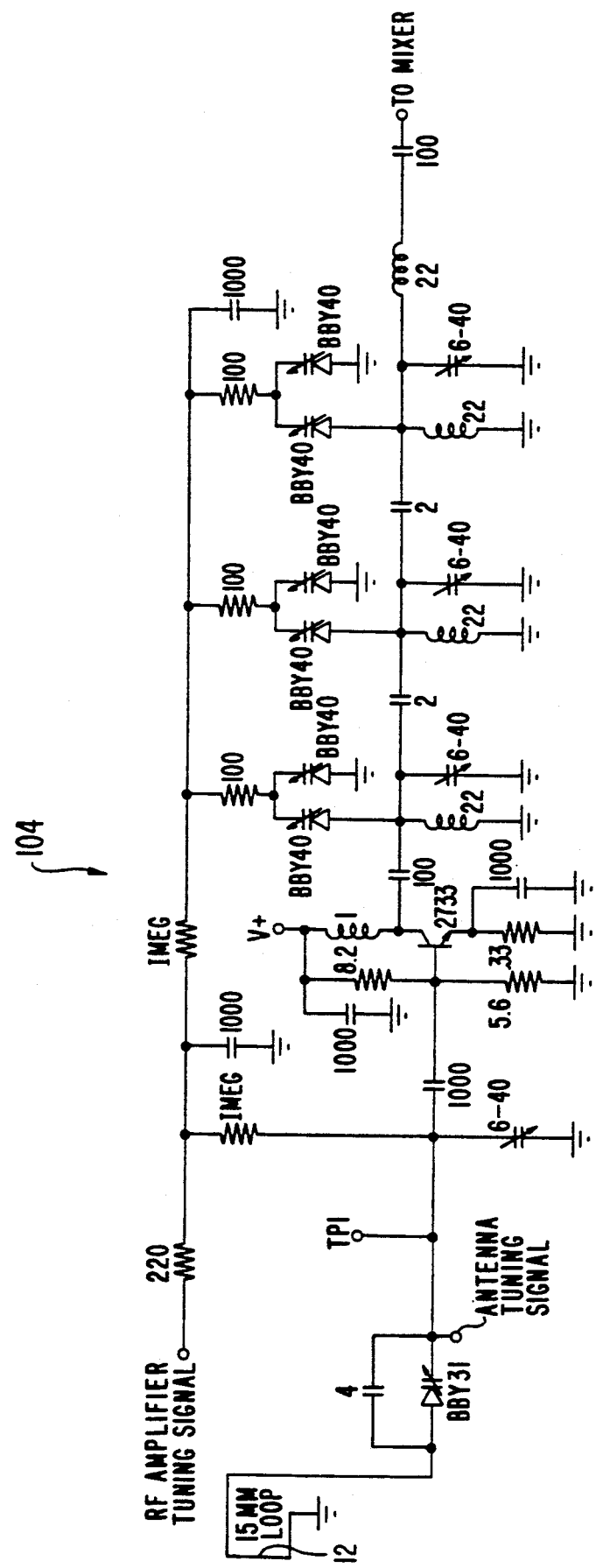
FIG. 6 illustrates a circuit schematic for implementing the RF amplifier 104 of the block diagram of FIG. 2.
Figure 7:
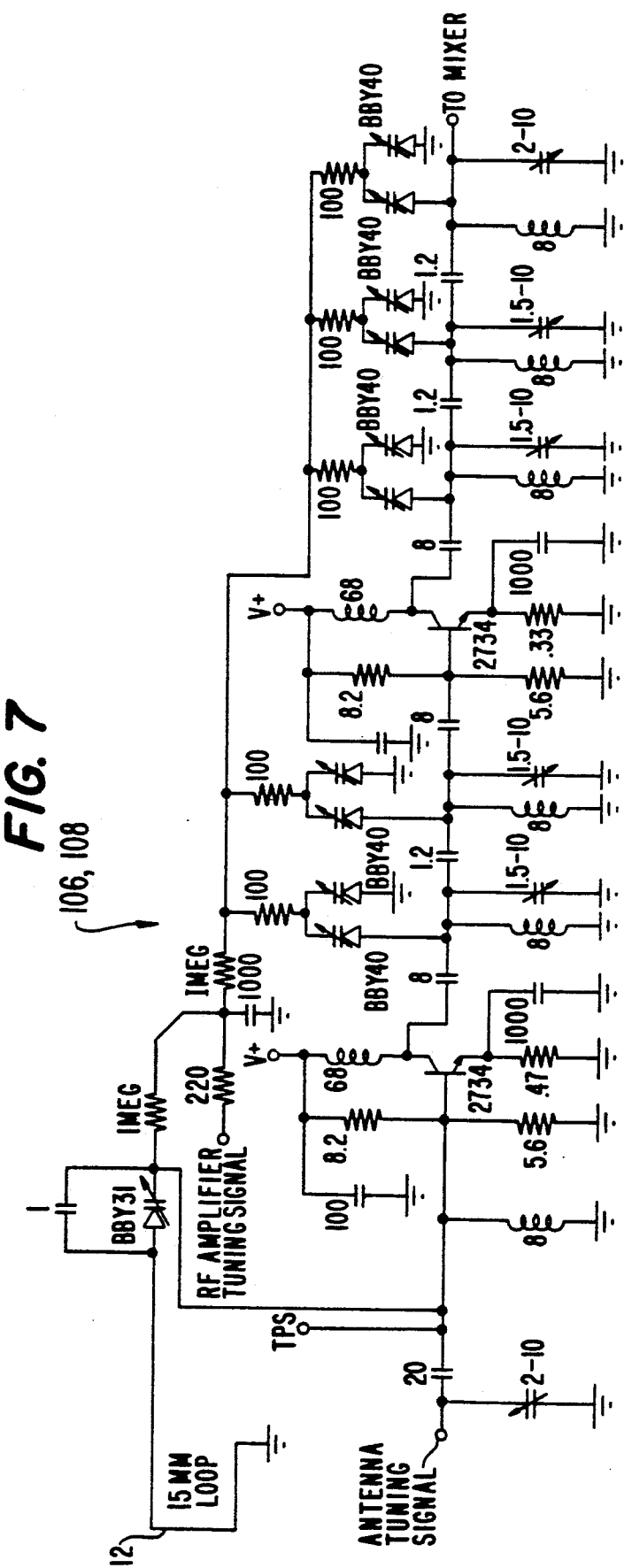
FIG. 7 illustrates a circuit schematic for implementing the RF amplifiers 106 and 108 of the block diagram of FIG. 2.

FIG. 5 illustrates the gain characteristic of each of the amplifiers of the RF amplifiers and mixers 104, 106 and 108 as a function of the overall bandwidth of each frequency band of channels which the amplifier amplifies. The center of amplifier operating bandwidth is shifted by varying the capacitance of varactor diodes contained in the amplifier as illustrated in FIGS. 6-7 discussed below under the control of the RF AMPLIFIER TUNING SIGNAL. The operating bandwidth has a 65 dB down point at +387.5 KHZ from the center frequency.

FIGS. 6-7 illustrate a circuit schematic of a preferred embodiment of the RF amplifiers contained in the RF amplifiers and mixers 104-108 of FIG. 2. It should be understood that the choice of the components within the RF amplifiers including values may be varied in accordance with the invention from those illustrated. Part numbers are the manufacturer's or industry designation. Resistance values are in thousands of ohms, capacitance values are in picofarads and inductance values are in nano henries. The gain of the antenna tuning is varied by application of the ANTENNA TUNING SIGNAL to the variable capacitance diode BBY 31 to change its capacitance proportionally to the ANTENNA TUNING SIGNAL. The operating bandwidth of the RF amplifier is shifted by application of the AMPLIFIER TUNING SIGNAL to the variable capacitance diodes BBY 40 to change their capacitance proportionally to the RF AMPLIFIER TUNING SIGNAL.

Figure 8:
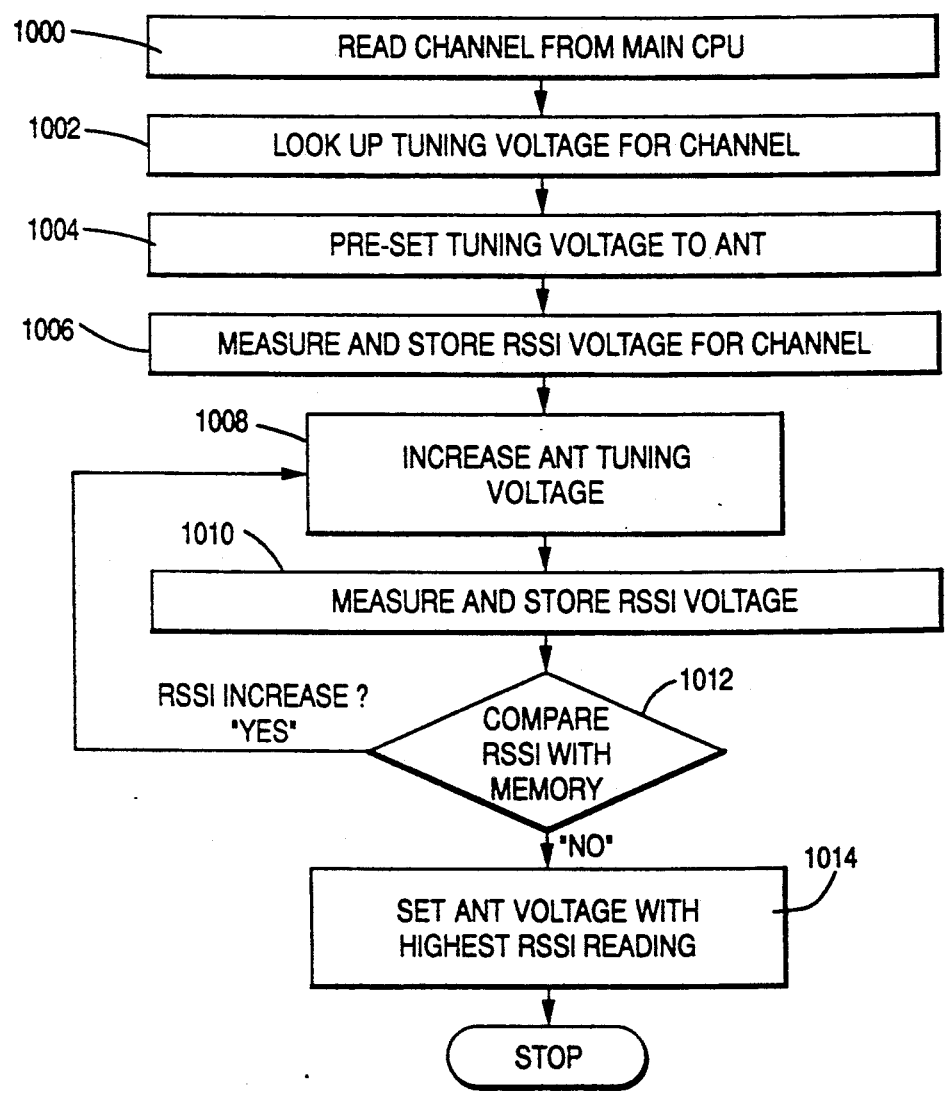
FIG. 8 is a flowchart illustrating the operation of the controller in tuning the antenna of a paging receiver in accordance with the present invention.

FIG. 8 illustrates a flowchart of the operation of the controller 102 with reference to FIG. 2 in producing the ANTENNA TUNING SIGNAL for optimizing the gain of the antenna 12 in receiving a specified channel which is outputted as indicated at point 1000 by the main CPU 24 and identified as the RECEIVER TUNING SIGNAL. The operation of the controller 102 proceeds to point 1002 where a stored ANTENNA TUNING SIGNAL, which is a function of the specified channel, is read out from memory within the controller 102 and applied to the varicap diode(s) as indicated at point 1004 within the antenna circuit 14. Preferably, the stored ANTENNA TUNING SIGNAL sets the voltage to approximately 15% less than the voltage which will produce maximum antenna gain for the specified channel. Each 13 MHz band is divided into twenty-six lookup voltages stored in the memory of the controller 102. The controller 102 chooses for the specific band within which the specified channel is located the stored ANTENNA TUNING SIGNAL which is assigned to the specified channel for initial tuning of the antenna 12. Accordingly, each channel within each band of channels which may be received has an assigned initial ANTENNA TUNING SIGNAL stored in the memory of the controller 102 which is approximately 15% less than the voltage which will produce maximum antenna gain.

The controller 102 measures and stores the magnitude of the RSSI SIGNAL outputted by the IF processing signal circuit 34 as indicated at point 1006. The controller 102 adds a predetermined incremental voltage increase to the previous ANTENNA TUNING SIGNAL which has been readout from memory as indicated at point 1008. At point 1010, the controller 102 measures and stores the RSSI SIGNAL as outputted by the IF processing signal circuit 34 in response to the increased voltage. The controller 102 compares at point 1012 the voltages which were stored at points 1006 and 1010 to determine if there is an increase. If the answer is "yes" at point 1012, the operation loops back to point 1008 to add another incremental voltage increase as described above with reference to points 1008 and 1010. If the answer is "no" at point 1012, the operation of the controller 102 proceeds to point 1014 where the ANTENNA TUNING SIGNAL is set to correspond to the highest RSSI SIGNAL. Furthermore, the loop comprised of steps 1008-1014 may be run a plurality of times, such as three times, prior to finally setting the ANTENNA TUNING SIGNAL to determine the optional voltage. The repeating of steps 1008-1014 enhances optimizing of the ANTENNA TUNING SIGNAL. Once the "no" decision is reached at point 1012, the RSSI SIGNAL will have increased in magnitude, reached a maximum and decreased in magnitude. Operation of the antenna circuit 14 for the specified channel in receiving pages on the specified channel is initially in accordance with the ANTENNA TUNING SIGNAL as determined at point 1014 and thereafter in accordance with the flowchart of FIG. 10 as described below.

While the invention has been described with the initial stored value of the ANTENNA TUNING SIGNAL contained in the memory of the controller 102 being less (preferably 15%) than the voltage which produces optimum antenna gain, it should be understood that the voltage magnitudes stored by the memory of the controller may alternatively be larger with the incremental voltage steps at point 1008 being decreases in voltage. Furthermore, the percentage less than the voltage which produces maximum gain which is stored by the memory of the controller 102 may be chosen to be different than 15%.

Figure 9:
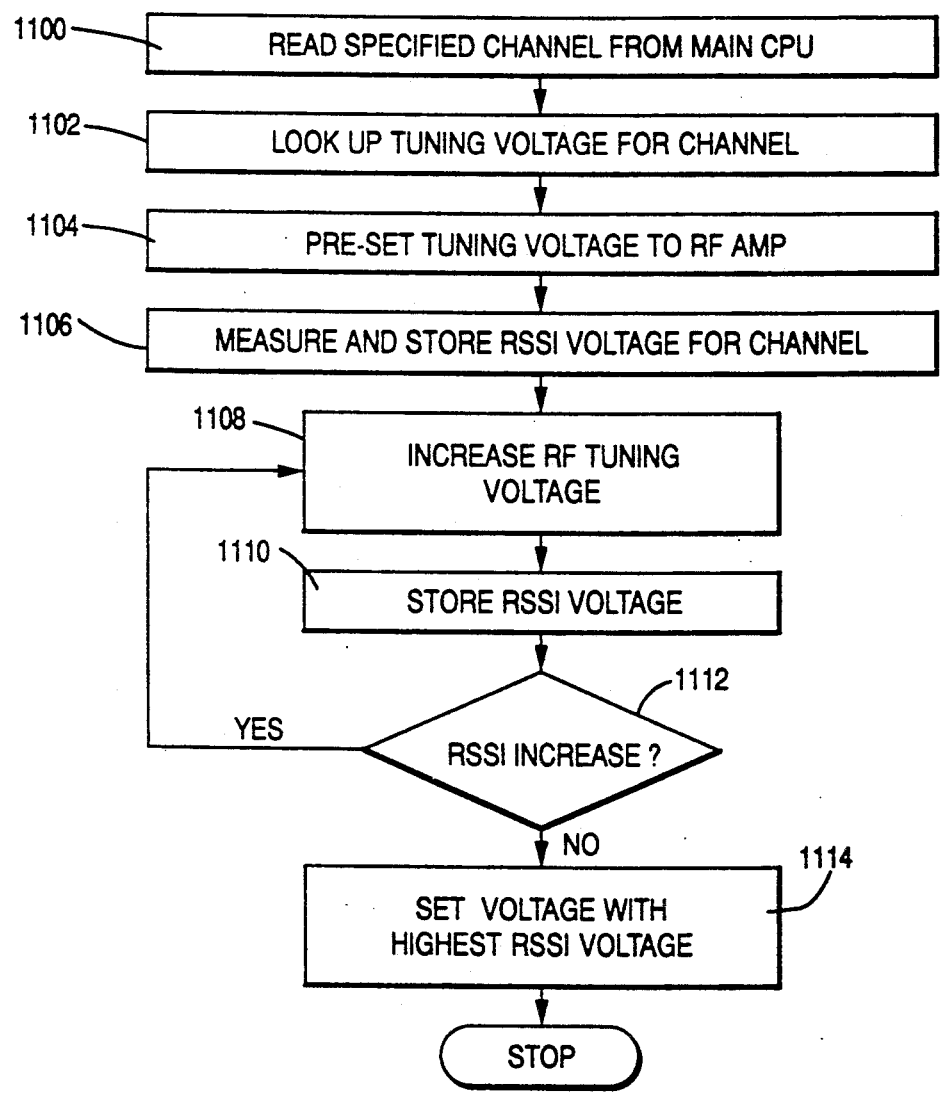
FIG. 9 is a flowchart illustrating the operation of the controller in tuning a RF amplifier in accordance with the present invention.

FIG. 9 illustrates a flowchart of the operation of the controller 102 in producing the RF AMPLIFIER TUNING SIGNAL with reference to FIG. 2 in optimizing the gain of the particular RF amplifier which is activated in receiving a specified channel from one of the frequency bands. The phase lock loop 28 is locked to the specified channel outputted by the main CPU 24 throughout the tuning process of an RF amplifier as described in detail below and during reception of the specified channel. It should be understood that each of the RF amplifiers 104-108 is tuned to a channel being received within the band of channels received by the RF amplifier upon application of power to the amplifier. The tuning process of an RF amplifier is analogous to the tuning process of the antenna 12 described above with reference to FIG. 8. The operation of the controller 102 proceeds at point 1100 where the specified channel to be received is read from the main CPU 24. The operation of the controller 102 proceeds to point 1102 where a stored RF AMPLIFIER TUNING SIGNAL voltage magnitude is read from the memory within the controller which is a function of the specified channel and the voltage is produced and is applied to the varicap diode(s) within the RF amplifier which receives the specified channel as indicated at point 1104. Preferably, the stored RF AMPLIFIER TUNING SIGNAL sets the voltage applied to RF amplifier to be less than the voltage which will produce maximum RF amplifier gain. Each 13 MHz band is divided into 8 lookup voltages stored in the memory of the controller 102. The controller 102 chooses for the specific band within which the specified channel is located the stored AMPLIFIER TUNING SIGNAL which is assigned to the specified channel for tuning of the RF amplifier. Accordingly, each channel within each band of channels which may be received has an assigned initial AMPLIFIER TUNING SIGNAL voltage magnitude stored in the memory of the controller 102 which is less than the voltage magnitude which will produce maximum RF amplifier gain. The controller 102 measures and stores the magnitude of the resultant RSSI SIGNAL produced by the IF processing circuit 34 in response to application of the stored AMPLIFIER TUNING SIGNAL to the RF amplifier as indicated at point 1106. The controller 102 adds a predetermined incremental voltage increase to the previous AMPLIFIER TUNING SIGNAL which has been readout from memory as indicated at point 1108. Each incremental voltage increase causes a shift in the center of the operating bandwidth of the RF amplifier 104-108 which is amplifying the channel specified by the RECEIVER TUNING SIGNAL. At point 1110 the controller 102 measures and stores the resultant RSSI SIGNAL as outputted by the IF processing signal circuit 34. The controller 102 compares at point 1112 the voltage magnitude which were stored at points 1106 and 1110 to determine if there was an increase. If the answer is "yes" at point 1112, the operation loops back to point 1108 to add another incremental voltage increase as described above with reference to points 1108 and 1110. If the answer is "no" at point 1112, the operation of the controller 102 proceeds to point 1114 where the AMPLIFIER TUNING SIGNAL is set to corresponds to a voltage which the highest RSSI SIGNAL produced. Setting of the AMPLIFIER TUNING SIGNAL to a voltage which produces the highest RSSI centers the operating bandwidth of the RF amplifier 104-108 to produce the highest gain for the channel specified by the RECEIVER TUNING SIGNAL. Operation of the RF amplifier receiving pages on the specified channel is in accordance with the AMPLIFIER TUNING SIGNAL determined at point 1014.

Figure 10:
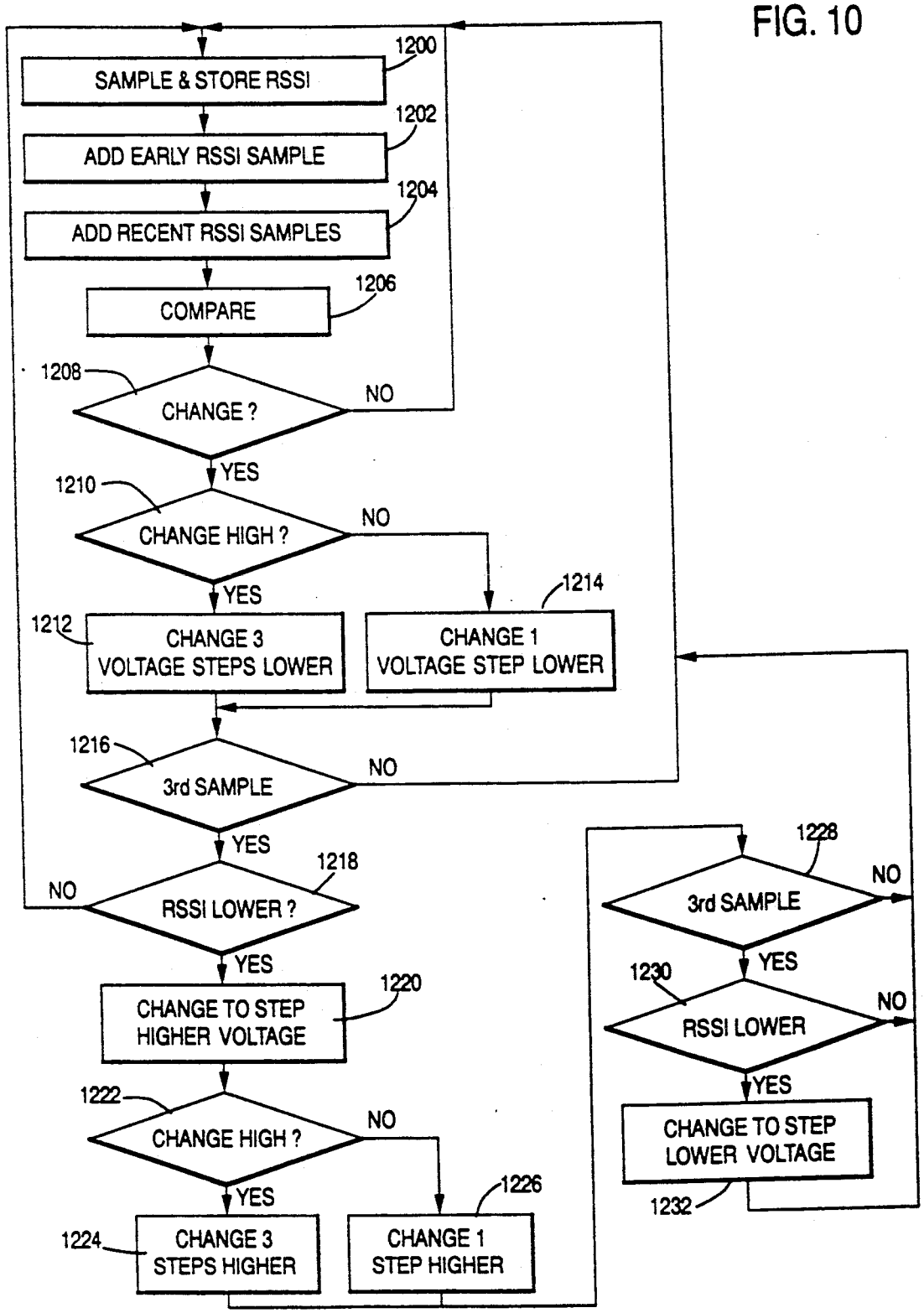
FIG. 10 is a flowchart illustrating the operation of the controller in fine tuning the gain of the antenna in accordance with the present invention.

FIG. 10 illustrates a flowchart of the operation of the controller 102 in continually fine tuning the ANTENNA TUNING SIGNAL during reception of pages to compensate for variation in antenna gain caused by factors such as, but not limited to, movement of the paging receiver with respect to objects in proximity to the paging receiver such as buildings or removal from a person's body. Factors of the above type can detune the antenna gain during reception of pages from the optimized value established by the initial tuning process described with reference to FIG. 8 above. The frequency response of the tuning process described below is chosen to be slow to prevent retuning the antenna circuit 14 by instantaneous changes of the RF media due to multipath Raleigh fading.

Once a tuning "history" has been obtained for a specific channel(s), the adjustment process proceeds as follows. The last six RSSI SIGNAL samples are compared to determine if the latest three samples are higher or lower than the three earlier samples. If the total of the previous samples exceeds the total of the latest samples, the controller 102 steps down the antenna tuning varactor voltage. The result of the measurements in this case indicates that the average received signal strength is less than previously received. Only the antenna varactor will be changed at this point, as the RF amplifier gain has been previously optimized in the initial tuning process as described with reference to FIG. 9 above. The controller 102 then decreases the ANTENNA TUNING SIGNAL one step or three steps depending on whether the difference is small or great. If three "adjustments" are made, and the RSSI average readings decrease, the controller 102 sets the tuning to the three previous adjustment voltages and will increase the AN- TENNA TUNING SIGNAL to optimize the received signal reading.

This step-by-step "fine" tuning of the antenna circuit optimizes the received signal under the above-identified varying conditions. It maintains certain boundaries of tuning limits as outside influences (such as signal strength in a tunnel or basement) which cannot be tuned or optimized.

Loop damping of the adjusting voltage occurs by the use of R-C time constants in the antenna circuit 14 and also due to the fact that samples of the RSSI SIGNAL are taken at approximately 900 millisecond intervals.

Operation of the controller 102 in "fine tuning" the antenna gain by dynamically varying the capacitance of varactor diodes contained in the antenna circuit 14 is described as follows with reference to FIG. 10. Operation proceeds from point 1200 where the RSSI SIGNAL is sampled. The sampling rate is preferably lower than a frequency at which transient signals would substantially influence the signal magnitude such as one every 900 milliseconds. Operation proceeds to point 1202 where previous samples such as the oldest three of six samples including the current sample are added. It should be understood that samples are continually being updated with new samples with older samples being discarded. Operation proceeds to point 1204 where the current samples, including the sample determined at point 1200, are added. At point 1206, the totals determined at points 1202 and 1204 are compared. If the comparison at point 1206 produces a difference less than a predetermined threshold indicative of significant signal strength variations as indicated at point 1208 by the determination "no", the operation loops back to point 1200. If the difference is greater than the predetermined threshold as indicated by "yes" at point 1208, it is necessary to vary the antenna gain to compensate for the signal strength variation indicated by variation in the RSSI SIGNAL magnitude. If the magnitude of change exceeding the threshold determined at point 1208 is greater than a threshold as determined at point 1210, the controller 102 steps down the ANTENNA TUNING SIGNAL by three predetermined increments as indicated at point 1212. However, if the change at point 1210 is less than the threshold, the controller 102 steps down the ANTENNA TUNING SIGNAL by one predetermined increment as indicated at point 1214. The series of steps at points 1200-1214 is repeated for three loops as indicated at point 1216. At point 1218 the effect of lowering the ANTENNA TUNING SIGNAL at points 1212 and/or 1214 during the three loops is determined. If the effect at point 1218 is determined to not be a lowering of the RSSI SIGNAL, operation loops back to point 1200 since the result produces increased antenna gain, as indicated by increased magnitude in the RSSI SIGNAL. The foregoing process continues as long as the RSSI SIGNAL continues to increase. However, if the effect at point 1218 is determined to be lowering of the RSSI SIGNAL operation proceeds to point 1220 which indicates that the voltage level of the ANTENNA TUNING SIGNAL must be increased as a consequence of decreases in the ANTENNA TUNING SIGNAL producing a decreased RSSI SIGNAL. Operation proceeds to point 1222 which is analogous to point 1210. Point 1224 is analogous to point 1212 except that the voltage is increased by three voltage increments. Point 1226 is analogous to point 1214 except that the voltage is increased by one voltage increment. Point 1228 is analogous to point 1216. Point 1230 is analogous to point 1218. Point 1232 indicates the changing of the increments of the ANTENNA TUNING SIGNAL to negative steps to counter the effect of the positive increments at points 1224 and/or 1226 in the next loop of processing when voltage increments are added points 1212 and/or 1214.

It should be understood that the foregoing operation may be modified to change the number of samples at points 1218 and 1228. Furthermore, the relative difference in the increments at points 1212 and 1214 and 1224 and 1226 may be changed from 3 to 1 to other values.

The processes illustrated in FIGS. 8-10 may be programmed in controller 102 by any known programming method or language. Furthermore, the processor 102 may be an ASIC or other controller implementation such as a custom masked CPU.

While the invention has been described in conjunction with FIG. 9 with the initial stored value of the AMPLIFIER TUNING SIGNAL contained in the memory of the controller 102 being less than the voltage which produces optimum amplifier gain, it should be understood that the voltage magnitudes stored by the memory of the controller may alternatively be larger with the voltage step at point 1108 being decreased. Furthermore, the percentage less than the voltage which produces maximum RF amplifier gain which is stored by the memory of the controller 102 may be chosen to have different values.

While the invention has been described in terms of a preferred embodiment, it should be understood that numerous modifications may be made thereto without departing from the spirit and scope of the present invention. For example, it should be understood that while the preferred embodiment of the present invention pertains to pages containing alphanumeric characters, it should be understood that the present invention may be also utilized with pages which contain either vocal messages alone or in combination with alphanumeric characters or other alarms such as tone alarms. Furthermore, while a separate RF amplifier is used for each frequency band of channels being received in a preferred embodiment of the invention, it should be understood that one RF amplifier may be used for amplifying signals from more than one frequency band such as the 280 and 450 MHz bands. It is intended that all such modifications fall within the scope of the appended claims.

We claim:

1. A RF paging receiver which is tunable to at least one specified channel comprising:
   a RF tuner, for receiving the specified channel in response to a channel tuning signal specifying reception of the specified channel;
   an intermediate frequency circuit coupled to the RF tuner for producing an intermediate frequency signal and a received signal strength indicator which is proportional to a level of the intermediate frequency signal;
   a controller, coupled to the intermediate frequency signal, controlling generation of the channel tuning signal to cause the RF tuner to be tuned to receive the specified channel and controlling generation of an amplifier tuning signal; and wherein
   the RF tuner comprises a tunable RF amplifier, responsive to the received signal strength indicator and a stored amplifier tuning signal which is a function of the channel being received, which maximized gain of the RF amplifier by shifting a center of an operating bandwidth of the RF amplifier in response to changing the amplifier tuning signal with the RF amplifier center operating bandwidth being shifted from a center operating bandwidth produced by the stored amplifier tuning signal by a change in magnitude of the amplifier tuning signal from the stored amplifier tuning signal until the received signal strength indicator reaches a maximum magnitude indicating maximum RF amplifier gain.

2. A RF receiver which is tunable to a plurality of channels within at least one frequency band comprising:
a RF tuner, for receiving a channel in response to a channel tuning signal specifying reception of the received channel and including a tunable RF amplifier having an operating bandwidth which is narrower in frequency than the at least one frequency band and which is shiftable to center a center of the operating bandwidth on the specified channel in response to varying an RF amplifier tuning signal to maximize gain of the RF amplifier;
an RF amplifier tuning signal generating circuit, responsive to a received signal strength indicator produced by an intermediate frequency circuit coupled to the RF amplifier during receiving the received channel and a stored amplifier tuning signal, for varying the RF amplifier tuning signal from the stored amplifier tuning signal to shift the center of the operating bandwidth from a center of the operating bandwidth produced by the stored amplifier tuning signal to another center of operating bandwidth which increases the received signal strength indicator to a maximum signal level resulting in maximum gain of the RF amplifier; and
a controller for controlling the generation of the applied channel tuning signal.

3. A RF receiver in accordance with claim 2 wherein:
the stored RF amplifier tuning signal is initially applied to the RF amplifier to cause the RF amplifier to have a gain which is chosen to not produce the maximum gain for the channel specified by the channel tuning signal and thereafter the RF amplifier tuning signal applied to the RF amplifier is changed from the stored RF amplifier tuning signal by the RF amplifier tuning signal generating circuit which shifts the center of the operating bandwidth of the RF amplifier to cause the received signal strength indicator to produce a maximum signal level resulting in maximum gain being produced by the RF amplifier for the channel specified by the channel tuning signal.

4. A RF receiver in accordance with claim 3 wherein:
the RF amplifier tuning signal generating circuit incrementally changes the amplifier tuning signal from the stored amplifier tuning signal until the signal level of the received signal strength indicator produced by the intermediate frequency circuit reaches a maximum level and in response to the received signal strength indicator reaching a maximum level sets the RF amplifier tuning signal to the RF amplifier tuning signal which produced the maximum level of the received signal strength indicator by the intermediate frequency signal circuit for receiving the channel specified by the channel tuning signal to cause the RF amplifier to produce maximum gain.

5. A RF receiver in accordance with claim 4 wherein:
the RF amplifier tuning signal generating circuit in producing the amplifier tuning signal which produces maximum gain executes a recurring process of incremental changing the RF amplifier tuning signal, storing a resultant signal level of the received signal strength indicator produced by the intermediate frequency circuit, compares the resultant signal level of the received signal strength indicator with a signal level of the received signal strength indicator produced by the intermediate frequency circuit produced prior to the incrementally changing the RF amplifier tuning signal to determine if the incremental change in RF amplifier tuning signal caused the resultant signal level of the received signal strength indicator from the intermediate frequency circuit to increase, and repeats incrementally changing of RF amplifier tuning signal, storing the resultant signal level of the received signal strength indicator and comparing the resultant and previous signal levels of the received signal strength indicator produced by the intermediate frequency circuit until the signal level of the received signal strength indicator produced by the intermediate frequency circuit reaches a maximum signal level.

6. A RF receiver in accordance with claim 5 wherein:
a phase locked loop coupled to the applied channel tuning signal;
a voltage controlled oscillator, coupled to the phase locked loop, for outputting a frequency specified by the applied channel tuning signal to a mixer within the RF tuner; and
the phase locked loop is locked to the specified channel during tuning of the RF amplifier and during reception on the specified channel.

7. A RF receiver in accordance with claim 6 wherein:
the RF amplifier tuning circuit stores a plurality of RF amplifier tuning signals and applies a single stored RF amplifier tuning signal to the tunable RF amplifier which is a function of the channel specified by the channel tuning signal.

8. A RF receiver in accordance with claim 7 wherein:
the channels to which the receiver is tunable are contained in a plurality of frequency bands with each band containing a plurality of channels to which the receiver is tunable with a plurality of RF amplifier tuning signals being stored for each band.

9. A RF receiver in accordance with claim 5 wherein:
the RF amplifier tuning circuit stores a plurality of RF amplifier tuning signals and applies a single stored RF amplifier tuning signal to the tunable RF amplifier which is a function of the channel specified by the channel tuning signal.

10. A RF receiver in accordance with claim 9 wherein:
the channels to which the receiver is tunable are contained in a plurality of frequency bands with each band containing a plurality of channels to which the receiver is tunable with a plurality of RF amplifier tuning signals being stored for each band.

11. A RF receiver in accordance with claim 4 wherein the RF tuner further comprises:
a phase locked loop coupled to the applied channel tuning signal;
a voltage controlled oscillator, coupled to the phase locked loop, for outputting a frequency specified by the applied channel tuning signal to a mixer within the RF tuner; and the phase locked loop is locked to the specified channel during tuning of the RF amplifier an during reception on the specified channel.

12. A RF receiver in accordance with claim 11 wherein:
the RF amplifier tuning circuit stores a plurality of RF amplifier tuning signals and applies a single stored RF amplifier tuning signal to the tunable RF amplifier which is a function of the channel specified by the channel tuning signal.

13. A RF receiver in accordance with claim 12 wherein:
the channels to which the receiver is tunable are contained in a plurality of frequency bands with each band containing a plurality of channels to which the receiver is tunable with a plurality of RF amplifier tuning signals being stored for each band.

14. A RF receiver in accordance with claim 4 wherein:
the RF amplifier tuning circuit stores a plurality of RF amplifier tuning signals and applies a single stored RF amplifier tuning signal to the tunable RF amplifier which is a function of the channel specified by the channel tuning signal.

15. A RF receiver in accordance with claim 14 wherein:
the channels to which the receiver is tunable are contained in a plurality of frequency bands with each band containing a plurality of channels to which the receiver is tunable with a plurality of RF amplifier tuning signals being stored for each band.

16. A RF receiver in accordance with claim 3 wherein:
the RF amplifier tuning circuit stores a plurality of RF amplifier tuning signals and applies a single stored RF amplifier tuning signal to the tunable RF amplifier which is a function of the channel specified by the channel tuning signal.

17. A RF receiver in accordance with claim 16 wherein:
the channels to which the receiver is tunable are contained in a plurality of frequency bands with each band containing a plurality of channels to which the receiver is tunable with a plurality of RF amplifier tuning signals being stored for each band.

18. A RF receiver in accordance with claim 3 wherein the RF tuner further comprises:
a phase locked loop coupled to the applied channel tuning signal;
a voltage controlled oscillator, coupled to the phase locked loop, for outputting a frequency specified by the applied channel tuning signal to a mixer within the RF tuner; and
the phase locked loop is locked to the specified channel during tuning of the RF amplifier and during reception on the specified channel.

19. A RF receiver in accordance with claim 18 wherein:
the RF amplifier tuning circuit stores a plurality of RF amplifier tuning signals and applies a single stored RF amplifier tuning signal to the tunable RF amplifier which is a function of the channel specified by the channel tuning signal.

20. A RF receiver in accordance with claim 19 wherein:
the channels to which the receiver is tunable are contained in a plurality of frequency bands with each band containing a plurality of channels to which the receiver is tunable with a plurality of RF amplifier tuning signals being stored for each band.

21. A RF receiver in accordance with claim 2 wherein the RF tuner further comprises:
a phase locked loop coupled to the applied channel tuning signal;
a voltage controlled oscillator, coupled to the phase locked loop, for outputting a frequency specified by the applied channel tuning signal to a mixer within the RF tuner; and
the phase locked loop is locked to the specified channel during tuning of the RF amplifier an during reception on the specified channel.

22. A RF receiver in accordance with claim 21 wherein:
the RF amplifier tuning circuit stores a plurality of RF amplifier tuning signals and applies a single stored RF amplifier tuning signal to the tunable RF amplifier which is a function of the channel specified by the channel tuning signal.

23. A RF receiver in accordance with claim 22 wherein:
the channels to which the receiver is tunable are contained in a plurality of frequency bands with each band containing a plurality of channels to which the receiver is tunable with a plurality of RF amplifier tuning signals being stored for each band.

24. A RF receiver in accordance with claim 2 wherein:
the RF amplifier tuning circuit stores a plurality of RF amplifier tuning signals and applies a single stored RF amplifier tuning signal to the tunable RF amplifier which is a function of the channel specified by the channel tuning signal.

25. A RF receiver in accordance with claim 24 wherein:
the channels to which the receiver is tunable are contained in a plurality of frequency bands with each band containing a plurality of channels to which the receiver is tunable with a plurality of RF amplifier tuning signals being stored for each band.

26. A RF receiver, which is tunable to a plurality channels in at least one frequency band, having a received signal strength which varies during the reception of a received channel within the at least one frequency band comprising:
a tunable antenna which is continuously tunable in response to an antenna tuning signal to vary antenna gain for a received channel during reception of a transmission on the received channel to produce a maximum antenna gain;
a RF tuner, coupled to the tunable antenna, for receiving the channel in response to a channel tuning signal specifying reception of the received channel;
an intermediate frequency circuit, coupled to the RF tuner, for producing an intermediate frequency signal and a received signal strength indicator which is proportional to a level of the signal on the received channel;
an antenna tuning circuit, responsive to the received signal strength indicator and to a stored antenna tuning signal which is a function of the channel being received, for continuously generating the antenna tuning signal which produces the maximum antenna gain for the received channel, the antenna tuning circuit comparing at least one current received signal strength indicator with at least one stored previous received signal strength indicator to determine if the at least one received current signal strength indicator is less than the at least one previous stored received signal strength indicator by an amount greater than a first threshold and if the difference is greater than the threshold the antenna tuning circuit changes the antenna tuning signal to cause an increase in the received signal strength indicator from the at least one current received signal strength indicator to a maximum signal level indicating the maximum antenna gain; and a controller controlling generation of the channel tuning signal to cause the RF tuner to be tuned to receiver the received channel.

27. A RF receiver in accordance with claim 26 wherein:

the at least one current received signal strength indicator is an average of a plurality of samples of the received signal strength indicator taken in time from a previously taken sample up to a current sample; and the at least one previous signal strength indicator is an average of a plurality of samples of the received signal strength indicator taken in time up to the previously taken sample which is included in the average of the plurality of samples within the average of the plurality of samples of current received signal strength indicator.

28. A RF receiver in accordance with claim 27 wherein:

the samples within the averages are taken as sequential samples.

29. A RF receiver in accordance with claim 28 wherein:

the change in the antenna tuning signal is produced by incrementally changing the antenna tuning signal produced by the antenna tuning circuit to cause the signal strength indicator to increase.

30. A RF receiver in accordance with claim 29 wherein:

the antenna tuning circuit incrementally changes the signal strength indicator by incrementally increasing or incrementally decreasing the antenna signal until the signal strength increases from the at least one current stored signal strength indicator.

31. A RF receiver in accordance with claim 30 wherein:

the incrementally increasing or decreasing of the antenna tuning signal is comprised of changes of the antenna tuning signal by a smaller increment if the change in signal strength indicator determined by the comparison of the stored signal strength indicators is less than a second threshold and by a larger increment if the change in signal strength indicator determined by the comparison of the stored signal strength indicators is greater than the second threshold.

32. A RF receiver in accordance with claim 26 wherein:

the change in the antenna tuning signal is produced by incrementally changing the antenna tuning signal produced by the antenna tuning circuit to cause the signal strength indicator to increase.

33. A RF receiver in accordance with claim 32 wherein:

the antenna tuning circuit incrementally changes the signal strength indicator by incrementally increasing or incrementally decreasing the antenna signal until the signal strength increases from the at least one current stored signal strength indicator.

34. A RF receiver in accordance with claim 33 wherein:

the incrementally increasing or decreasing of the antenna tuning signal is comprised of changes of the antenna tuning signal by a smaller increment if the change in signal strength indicator determined by the comparison of the stored signal strength indicators is less than a second threshold and by a larger increment if the change in signal strength indicator determined by the comparison of the stored signal strength indicators is greater than the second threshold.

35. A RF receiver in accordance with claim 27 wherein:

the change in the antenna tuning signal is produced by incrementally changing the antenna tuning signal produced by the antenna tuning circuit to cause the signal strength indicator to increase.

36. A RF receiver in accordance with claim 35 wherein:

the antenna tuning circuit incrementally changes the signal strength indicator by incrementally increasing or incrementally decreasing the antenna signal until the signal strength increases from the at least one current stored signal strength indicator.

37. A RF receiver in accordance with claim 36 wherein:

the incrementally increasing or decreasing of the antenna tuning signal is comprised of changes of the antenna tuning signal by a smaller increment if the change in signal strength indicator determined by the comparison of the stored signal strength indicators is less than a second threshold and by a larger increment if the change in signal strength indicator determined by the comparison of the stored signal strength indicators is greater than the second threshold.

38. A RF receiver, which is tunable to a plurality of channels within at least one frequency band, having a received signal strength which varies during the reception of a received channel within the at least one frequency band comprising:

a tunable antenna which is continuously tunable in response to an antenna tuning signal to vary antenna gain for a received channel during reception of a transmission on the received channel to produce maximum antenna gain;

a RF tuner, coupled to the tunable antenna, for receiving a channel in response to a channel tuning signal specifying reception of the received channel and including a tunable RF amplifier having an operating bandwidth which is narrower in frequency than the at least one frequency band and which is shiftable to center a center of the operating bandwidth on the specified channel in response to varying an RF amplifier tuning signal to maximize gain of the RF amplifier;

an RF amplifier tuning signal generating circuit, responsive to a received signal strength indicator produced by an intermediate frequency circuit coupled to the RF amplifier during receiving the received channel and a stored amplifier tuning signal, for varying the RF amplifier tuning signal from the stored amplifier tuning signal to shift the center of the operating bandwidth from a center of the operating bandwidth produced by the stored amplifier tuning signal to another center of operating bandwidth to maximize signal level resulting in maximize gain of the RF amplifier;

an antenna tuning circuit, responsive to the received signal strength indicator and to a stored antenna tuning signal which is a function of the channel being received, for continuously generating the antenna tuning signal which produces the maximum antenna gain for the received channel, the antenna tuning circuit comparing at least one current received signal strength indicator with at least one previous stored received signal strength indicator to determine if the at least one received current signal strength indicator is less than the at least one previous stored received signal strength indicator by an amount greater than a threshold and if the difference is greater than the threshold the antenna tuning circuit changes the antenna tuning signal to increase the signal strength indicator from the at least one current signal strength indicator to a maximum signal level to produce the maximum antenna gain; and a controller controlling generating of the channel tuning signal to cause the RF tuner to be tuned to receive the received channel.

* * * * *